United States Patent [19]

Asai et al.

[11] Patent Number: 4,562,371
[45] Date of Patent: Dec. 31, 1985

[54] RAYLEIGH SURFACE-ACOUSTIC-WAVE DEVICE USING ZNO(0001)/SIO$_2$/SI(111) [11$\bar{2}$]

[75] Inventors: Ryuichi Asai; Takeshi Okamato; Shoichi Minagawa, all of Tokyo, Japan

[73] Assignee: Clarion Co., Ltd., Tokyo, Japan

[21] Appl. No.: 677,713

[22] Filed: Dec. 4, 1984

[30] Foreign Application Priority Data

Dec. 9, 1983 [JP] Japan ................ 58-232446

[51] Int. Cl.$^4$ .......................................... H01L 41/08
[52] U.S. Cl. .................................. 310/313 A; 333/154
[58] Field of Search ........... 310/313 R, 313 A, 313 B, 310/313 C, 313 D; 333/150–155, 193–196

[56] References Cited

U.S. PATENT DOCUMENTS

| | | | |
|---|---|---|---|
| 4,037,176 | 7/1977 | Ono et al. | 310/313 A |
| 4,194,171 | 3/1980 | Jelks | 310/313 B |
| 4,480,209 | 10/1984 | Okamoto et al. | 310/313 B |

OTHER PUBLICATIONS

Monolithic ZnO on Si Schottky Diode Storage Correlator, by R. L. Thornton et al, 1980, Ultrasonics Symposium, Boston Ma, (IEEE), Nov. 5–7, 1980, pp. 124–128.
Monolithic Sezawa Wave Storage Correlators and Convolvers, by J. E. Bowers et al, 1980 Ultrasonics Symposium, Boston Ma, (IEEE), Nov. 5–7, 1980, pp. 118–123.

*Primary Examiner*—Mark O. Budd
*Attorney, Agent, or Firm*—Flynn, Thiel, Boutell & Tanis

[57] ABSTRACT

A surface acoustic wave device comprises a silicon substrate, a conductive layer provided on the silicon substrate, a silicon dioxide layer provided on the conductive layer, input and output electrodes provided on the silicon dioxide layer for input and output of a surface acoustic wave, and a zinc oxide layer provided on the electrodes. The silicon substrate is cut by a crystalline surface substantially equivalent to the (111)-surface, and the zinc oxide layer is such that its crystalline surface substantially equivalent to the (0001)-surface is parallel to the cut-surface of the silicon substrate, so that the surface acoustic wave entered by the input electrode travels to the output electrode in a direction substantially equivalent to the [11$\bar{2}$]-axis of the silicon substrate.

9 Claims, 7 Drawing Figures

RAYLEIGH SURFACE-ACOUSTIC-WAVE DEVICE USING ZNO(0001)/SIO$_2$/SI(111) [11$\bar{2}$]

FIELD OF THE INVENTION

This invention relates to a surface acoustic wave device.

BACKGROUND OF THE INVENTION

There are a great demand and progress of surface-acoustic-wave devices of various types which use a surface acoustic wave propagated near the surface of an elastic solid. One of the reasons of the development is that a surface acoustic wave travels so slowly as $10^{-5}$ times the speed of an electromagnetic wave and hence enables an extreme reduction in size of the device. Another reason is that a surface acoustic wave which travels near the surface of a solid can be readily picked up from any point of the propagation path. A further reason is that since energies are concentrated near the surface of a solid, the device can be used as a device which utilizes an interaction between light and a carrier of a semiconductor or a nonlinearity due to the high energy concentration. A still further reason is that the device can be fabricated by a circuit integration technology and hence readily combined with integrated circuits to provide a new device.

FIGS. 1 and 2 show structures of the prior art surface-acoustic-wave devices. Reference numeral 1 denotes a piezoelectric substrate made from lithium niobate (LiNbO$_3$), 2 is a semiconductor substrate made of silicon which is cut by a crystalline surface substantially equivalent to the (100)-surface, 3 is a piezoelectric layer made from zinc oxide (ZnO) whose crystalline surface substantially equivalent to the (0001)-surface is parallel to the said cut surface of the silicon substrate 2, and 4 and 5 are comb-shaped electrodes which are provided on the lithium niobate substrate 1 or on the silicon substrate 2, with their splits interdigitating each other. For example, the electrode 4 is used as input electrode and the electrode 5 is used as output electrode.

A surface acoustic wave excited and entered by the input electrode 4 travels along the surface of the lithium niobate substrate 1 or of the silicon substrate 2 and is picked up from the output electrode 5.

If a Rayleigh wave is used as said surface acoustic wave, the device of FIG. 1 provides a large value in square K$^2$ of the electromechanical coupling coefficient K which is one of the most important factors of the device's nature. This advantage increases the demand of the device in various technical fields. However, since the substrare is made from a single material, the device of FIG. 1 involves such a drawback that the electromechanical coupling coefficient K is fixed by the crystalline axis direction of the substrate and the travelling direction of a surface acoustic wave.

In FIG. 2, however, if a Rayleigh wave is propagated in the [11$\bar{2}$]-axis direction of the silicon substrate 2, the device may have a flexible K$^2$ characteristic and a larger electromechanical coupling coefficient K by selecting a thickness h$_1$ of the zinc oxide layer 3 which is obtained by an analysis. For example, if the thickness h$_1$ is selected so as to satisfy the relation $\omega h_1 = 8500$ (where $\omega$ is the angular frequency of the surface acoustic wave), K$^2$ becomes 3.05% approximately. The device of FIG. 2, however, is expensive because it needs an increased thickness of the zinc oxide layer which is normally fabricated by a sputtering technology.

OBJECT OF THE INVENTION

It is therefore an object of the invention to provide a surface acoustic wave device which has a reduced thickness of the zinc oxide layer and represents a larger electromechanical coupling coefficient K.

SUMMARY OF THE INVENTION

In accordance with the present invention, there is provided a surface acoustic wave device comprising:

a silicon substrate which is cut with a crystalline surface substantially equivalent to the (111)-surface;

a conductive layer provided on said silicon substrate;

a silicon dioxide layer provided on said conductive layer;

electrodes provided on said silicon dioxide layer for input and output of a surface acoustic wave; and a zinc oxide layer provided on said electrodes so that a crystalline surface thereof substantially equivalent to the (0001)-surface is parallel to said (111)-oriented surface of said silicon substrate, said surface acoustic wave entered from said input electrode travelling in a direction substantially equivalent to the [11$\bar{2}$]-axis of said silicon substrate up to said output electrode.

The invention will be better understood from the description given below, referring to some embodiments illustrated.

DETAILED DESCRIPTION OF THE PREFERRED EMBODIMENTS

Figure 3:
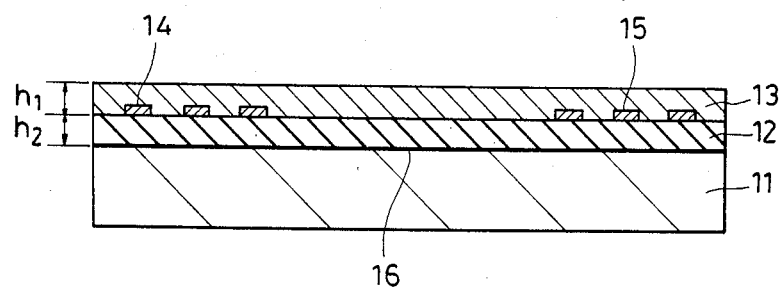
FIGS. 3 and 5 are sectional views of surface acoustic wave devices embodying the invention.

FIG. 3 is a sectional view of a surface acoustic wave device embodying the invention. Reference numeral 11 denotes a silicon substrate having a (111)-oriented major surface. Reference numeral 12 designates a silicon dioxide (SiO$_2$) layer deposited on the major surface of the silicon substrate 11 and having a thickness h$_2$. Reference numeral 13 denotes a zinc oxide layer with a thickness h$_1$ which is deposited on the silicon dioxide layer 12 so that a substantially (0001)-oriented major surface thereof extends parallel to the major surface of the silicon substrate 11. Reference numerals 14 and 15 denote input and output electrodes for input and output of a surface acoustic wave such as a Rayleigh wave. The respective electrodes 14 and 15 are interdigitating, comb-shaped electrodes provided on the zinc oxide layer 12. Reference numeral 16 denotes a conductive layer interposed between the silicon substrate 11 and the silicon dioxide layer 12 and is prefereably so thin as possible. The conductive layer is not restricted to a metal layer but may be a superficial part of a substrate significantly increased in conductivity.

Figure 6:
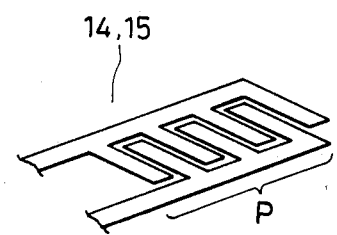
FIG. 6 is a schematic view of a comb-shaped electrode of the inventive device.

The conductive layer 16 or the zinc oxide layer 13 is preferably provided just above or below the interdigitating part P of the comb-shaped electrodes 14 and 15 as shown in FIG. 6.

Figure 4:
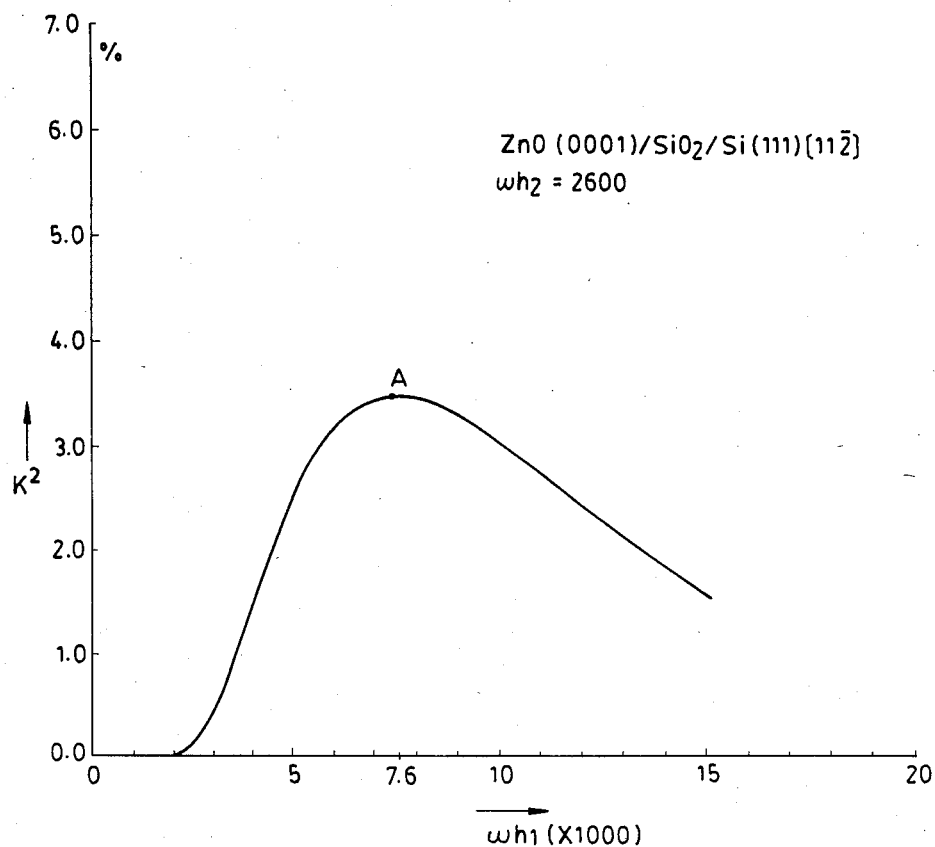
FIG. 4 is a graph showing characteristics of the inventive device.

With this arrangement (hereinafter called "ZnO(0001)/ SiO$_2$/Si(111)[11$\bar{2}$]"), when a Rayleigh wave is propagated in the [11$\bar{2}$]-axis direction of the silicon substrate 11, the device represents the K$^2$ characteristics as shown in FIG. 4.

In FIG. 4, the abscissa expresses the thickness h$_1$ of the zinc oxide layer 13 by $\omega$h$_1$ (where $\omega$ is the angular frequency), and the ordinate shows the square K$^2$ of the electromechanical coupling coefficient K by percentage. The Figure shows variations of K$^2$ where $\omega$h$_1$ is varied (preferably in the range between 4000–12000) under $\omega$h$_2$=2600. The thickness h$_2$ of the silicon dioxide layer 12 may be varied in the range $0 \leq \omega h_2 \leq 10000$.

As seen from FIG. 4, by selecting the thickness h$_1$ and h$_2$ of the zinc oxide layer 13 and the silicon dioxide layer 12 so that $\omega h_1 = 7600$ and $\omega h_2 = 2600$, the maximum value K$^2 = 3.49\%$ is obtained at a point A.

Figure 1:
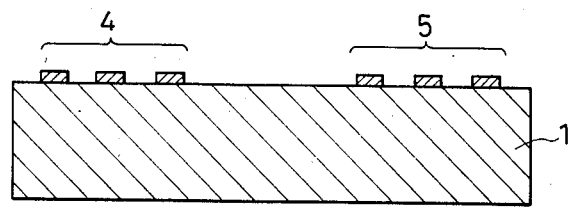
FIGS. 1 and 2 are sectional views of prior art surface acoustic wave devices.
Figure 2:
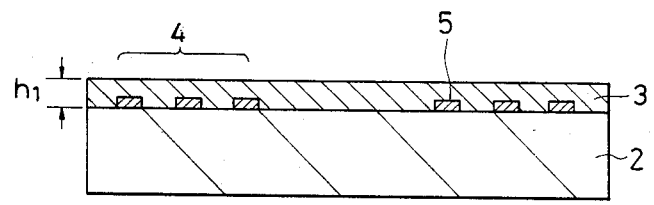

The above value is larger than the value (K$^2 = 3.05\%$, $\omega h_1 = 8500$) obtained by the prior art construction of FIG. 2. Additionally, the thickness h$_1$ of the zinc oxide layer 13 is decreased from the prior art value $\omega h_1 = 8500$ to $\omega h_1 = 7600$ by interposing the silicon dioxide layer 12. This contributes to a cost reduction in fabrication of the device.

Other variations of the thicknesses h$_1$ and h$_2$ of the zinc oxide layer 13 and the silicon dioxide layer 12 within the above-mentioned ranges also give improved characteristics and flexibility to the surface acoustic wave devcie as compared to the prior art construction.

No substantial difference is found in characteristics of the device when the orientations of the major surface of the silicon substrate 11 and the zinc oxide layer 13 deviate within 10 degrees from (111) and (0001) respectively and the propagation axis of the silicon substrate 11 deviates within 10 degrees from [11$\bar{2}$].

Figure 5:
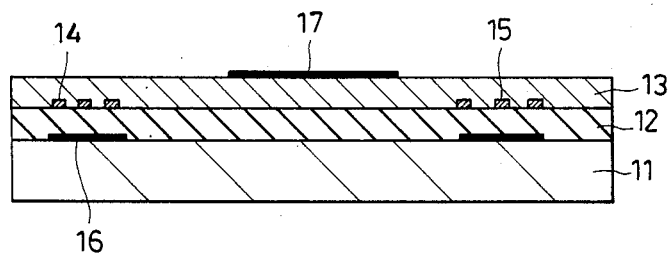

Referring now to FIG. 5 which shows a convolver device having the inventive construction, reference numeral 17 designates a gate electrode provided on the zinc oxide layer 13 in a central portion between the input and output electrodes 14 and 15. This also gives the substantially same excellent K$^2$ characteristics as in the former embodiment.

It is also expected to provide a device which uses an electrical potential generated within the silicon substrate 11, the silicon dioxide layer 12 and the zinc oxide layer 13, without using the comb-shaped electrodes.

As described above, the inventive device comprises the silicon substrate with the (111)-oriented major surface, the silicon dioxide layer provided on the silicon substrate, the zinc oxide layer provided on the silicon dioxide layer with its (0001)-oriented major surface disposed parallel to the major surface of the silicon substrate, the electrodes provided on the silicon dioxide layer, and further includes the conductive layer interposed between the silicon substrate and the silicon dioxide layer, so that a surface acoustic wave travels in the [11$\bar{2}$]-axis direction of the silicon substrate. Therefore, it is possible to increase the electromechanical coupling coefficient and hence to ensure an effective operation of the surface acoustic wave device.

Figure 7:
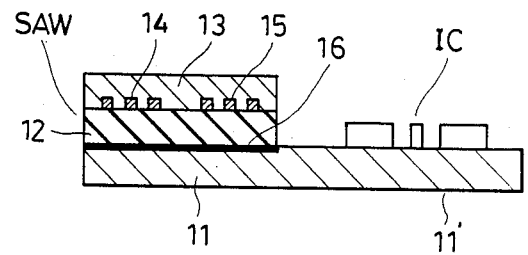
FIG. 7 schematically shows a further embodiment of the invention.

Further, as shown in FIG. 7, by using a single silicon substrate as the substrate 11 of the inventive surface acoustic wave device SAW and also as a substrate 11' of an integrated circuit IC connected to the input and output electrodes of the surface acoustic wave device, it is possible to unite a functional device and a semiconductive device by the circuit integration technology to provide a more compact circuit system with much more circuit elements combined.

The embodiments of the invention in which an exclusive property or privilege is claimed are defined as follows:

1. A surface acoustic wave device comprising:
   a silicon substrate which is cut with a crystalline surface substantially equivalent to the (111)-surface;
   a conductive layer provided on said silicon substrate;
   a silicon dioxide layer provided on said conductive layer;
   electrodes provided on said silicon dioxide layer for input and output of a surface acoustic wave; and
   a zinc oxide layer provided on said electrodes so that a crystalline surface thereof substantially equivalent to the (0001)-surface is parallel to said (111)-oriented surface of said silicon substrate, said surface acoustic wave entered from said input electrode travelling in a direction substantially equivalent to the [11$\bar{2}$]-axis of said silicon substrate up to said output electrode.

2. A surface acoustic wave device of claim 1 wherein said crystalline surfaces of said zinc oxide layer and said silicon substrate and said wave travelling axis of said silicon substrate are deviated within 10 degrees from (0001)- and (111)-surfaces and [11$\bar{2}$]-axis, respectively.

3. A surface acoustic wave device of claim 2 wherein said surface acoustic wave is a Rayleigh wave.

4. A surface acoustic wave device of claim 3 wherein said zinc oxide layer has a thickness h$_1$ which satisfies the relation $4000 \leq \omega h_1 < 12000$ (where $\omega$ is the angular frequency of said surface acoustic wave).

5. A surface acoustic wave device of claim 4 wherein said silicon dioxide layer has a thickness h$_2$ which satisfies the relation $0 \leq \omega h_2 \leq 10000$ (where $\omega$ is the angular frequency of said surface acoustic wave).

6. A surface acoustic wave device of claim 5 wherein said each electrode has a comb-shaped structure.

7. A surface acoustic wave device of claim 6 wherein said conductive layer is placed at least just below interdigitating portions of said comb-shaped electrodes.

8. A surface acoustic wave device of claim 6 wherein said zinc oxide layer is placed at least just above interdigitating portions of said comb-shaped electrodes.

9. A surface acoustic wave device of claim 8 wherein said silicon substrate is a substrate also carrying thereon an integrated circuit to be connected to said input and output electrodes.

* * * * *